United States Patent
Seijo et al.

(10) Patent No.: US 6,773,873 B2
(45) Date of Patent: Aug. 10, 2004

(54) PH BUFFERED COMPOSITIONS USEFUL FOR CLEANING RESIDUE FROM SEMICONDUCTOR SUBSTRATES

(75) Inventors: Ma. Fatima Seijo, Hayward, CA (US); William A. Wojtczak, Austin, TX (US); David Bernhard, Newton, CT (US); Thomas H. Baum, New Fairfield, CT (US); David Minsek, Pleasantville, NY (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/105,704

(22) Filed: Mar. 25, 2002

(65) Prior Publication Data

US 2003/0181342 A1 Sep. 25, 2003

(51) Int. Cl.⁷ .............................. G03F 7/42; C11D 9/00; C11D 9/02; C23G 1/02; C23G 1/00; C03C 23/00
(52) U.S. Cl. ..................... 430/329; 430/331; 134/2; 134/3; 510/175; 510/176; 510/255; 510/257; 510/259; 510/178; 510/265
(58) Field of Search ................... 510/175, 176, 510/178, 255, 257, 259, 265; 430/329, 331; 134/2, 3

(56) References Cited

U.S. PATENT DOCUMENTS

| | | | |
|---|---|---|---|
| 4,343,884 A * | 8/1982 | Muller et al. ................ | 430/331 |
| 4,592,787 A * | 6/1986 | Johnson ....................... | 510/175 |
| 5,252,245 A * | 10/1993 | Garabedian et al. ......... | 510/175 |
| 5,698,503 A | 12/1997 | Ward et al. | |
| 5,792,274 A | 8/1998 | Tanabe et al. | |
| 5,905,063 A | 5/1999 | Tanabe et al. | |
| 5,962,385 A | 10/1999 | Maruyama et al. | |
| 6,066,763 A * | 5/2000 | Hayakawa ................... | 562/581 |
| 6,197,733 B1 | 3/2001 | Mikami et al. | |
| 6,200,891 B1 | 3/2001 | Jagannathan et al. | |
| 6,224,785 B1 | 5/2001 | Wojtczak et al. | |
| 6,235,693 B1 | 5/2001 | Cheng et al. | |
| 6,248,704 B1 | 6/2001 | Small et al. | |
| 6,265,309 B1 | 7/2001 | Gotoh et al. | |
| 6,310,019 B1 * | 10/2001 | Kakizawa et al. ........... | 510/175 |
| 6,367,486 B1 | 4/2002 | Lee et al. | |
| 6,399,552 B1 | 6/2002 | Lee et al. | |
| 6,432,209 B2 * | 8/2002 | Sahbari ....................... | 510/176 |
| 6,447,563 B1 | 9/2002 | Mahulikar | |
| 6,465,404 B2 * | 10/2002 | Scriven et al. .............. | 510/255 |
| 2002/0077259 A1 * | 6/2002 | Skee ............................ | 510/175 |
| 2003/0022800 A1 * | 1/2003 | Peters et al. ................. | 510/175 |

* cited by examiner

*Primary Examiner*—Richard L. Schilling
(74) *Attorney, Agent, or Firm*—Margaret Chappuis; William F. Ryann (57) ABSTRACT

A semi-aqueous cleaning formulation useful for removing particles from semiconductor wafer substrates formed during a dry etching process for semiconductor devices, the cleaning formulation comprising a buffering system a polar organic solvent, and a fluoride source.

14 Claims, 5 Drawing Sheets

PH BUFFERED COMPOSITIONS USEFUL FOR CLEANING RESIDUE FROM SEMICONDUCTOR SUBSTRATES

FIELD OF THE INVENTION

The present invention relates to a semi-aqueous cleaning formulation for use in producing semiconductor devices and a process for producing semiconductor devices using the cleaning formulation. More particularly, the present invention relates to a semi-aqueous cleaning formulation useful for cleaning organic materials, organometallic residues, organosilicon residues, sidewall polymers and inorganic residues from a semiconductor substrate.

BACKGROUND OF THE INVENTION

The process of wafer fabrication includes a series of putting down layers. Each layer involves a series of steps, which may comprise all or some of photolithography, etch, strip, diffusion, ion implant, deposition, and chemical mechanical polishing.

Photolithography is the process through which images are transferred to the surface of a wafer by means of a light sensitive polymeric film layer (photoresist). The image is transferred from a mask to the photoresist layer by a developing process, which includes exposing regions of the film to a light/UV source, which are not blocked by the mask, resulting in a pattern on the wafer.

Figure 1A:
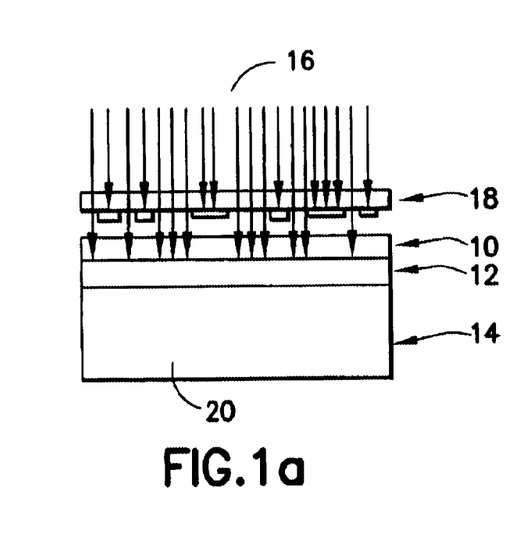
FIGS. 1(a)–1(d) shows four key photolithographic steps for an exemplary photoresist process.
Figure 1B:
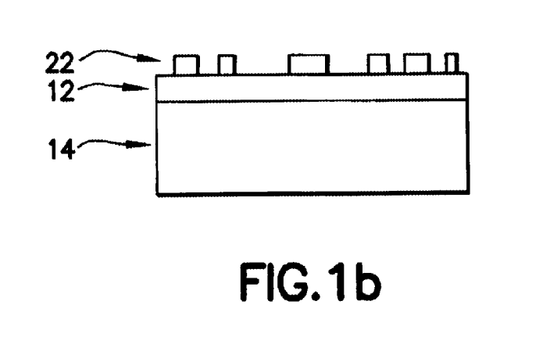
Figure 1C:
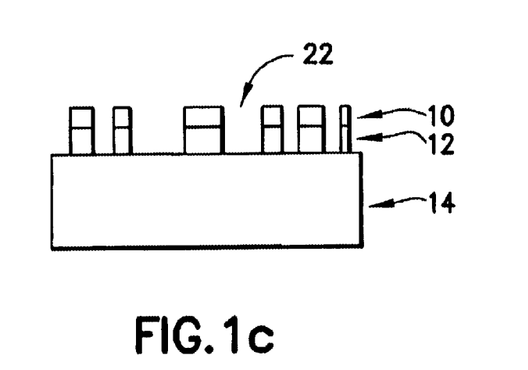

FIGS. 1(a)–1(d) depict four key photolithographic steps for an exemplary photoresist process. In FIG. 1a, photoresist (10) is deposited on a silicon dioxide, dielectric, hard mask, etch stop, and/or barrier layer (12) on silicon substrate (14). A light source (16) (as indicated by the down ward facing arrows) exposes the resist (10) not blocked by mask (18). The exposed resist (20), (the areas where the down arrows penetrate the resist layer), is dissolved in a developing solution, leaving a resist pattern identical to the mask (18). FIG. 1(b) depicts the resist pattern (22) on silicon dioxide layer (12) after dissolution of the exposed resist. In FIG. 1(c), the silicon dioxide layer (12) is then put into a plasma etch process or wet etch process typically using a fluorinated compound to remove the oxide in areas not protected by resist (22), to create a patterned silicon dioxide layer of vias and/or trenches. At this point, the photoresist has served its useful purpose and must be removed by an ashing and/or wet stripping step. The resist must be entirely removed since it is an organic material, which, if left on the wafer surface, would cause defects.

The plasma etch process used to remove the silicon dioxide or other substrate material requires exposing the substrate surface to UV radiation. The radiation tends to cross link the photoresist material making it more difficult to remove in the subsequent ashing or wet stripping step.

Figure 1D:
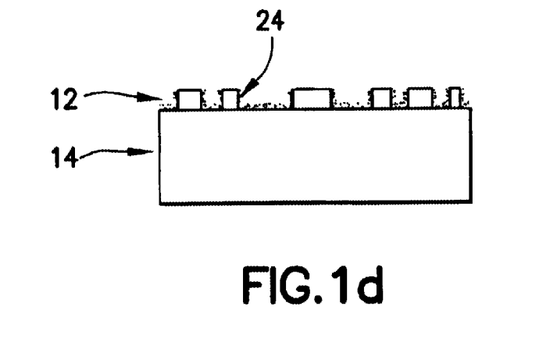

Ashing is a general term used for a process, which includes removing a photoresist coating by exposing the photoresist-coated wafer to an oxygen or hydrogen plasma in order to burn the resist film from the substrate surface. Alternatively, wet stripping typically involves contacting the photoresist-covered substrate with a stripper solution consisting primarily of an organic solvent and an amine. Of the two, plasma ashing is the more popular method for removing photoresist because it is less susceptible to contamination, as the process is carried out in a vacuum. FIG. 1(d) shows a patterned silicon dioxide layer (12), on the silicon substrate (14) after plasma ashing removal of the photoresist layer having particles and residues (24) left behind from the ashing process.

Prior to trench or via fill, the wafer surface must be cleaned of particles and residues left behind from the plasma etch and resist removal processes. The deposits may vary, but will most likely include at least an etching gas component, a component of the film being patterned by etching, and photoresist. If left in place, the deposits would cause a significant deterioration in the reliability of the semiconductor device. Accordingly, the wafer surface must be sufficiently cleaned of such deposits.

As fabs work to integrate new materials such as copper, and low dielectric constant materials, a need emerges for new cleaning techniques for post etch and post ash residue removal, where long trenches and narrow vias trap particles. Integration of low-dielectric constant materials with k<3.0 with existing aluminum or new copper damascene processes has been difficult to overcome.

Low-dielectric constant films such as carbon-doped oxide (OSG) comprise Si—O, Si—H and Si—C linkages. The film structure is preferably porous, whereby the porous nature of the film is due to the loss of volatile organic species or the inherent structure of the precursor material(s). In the presence of highly acidic or alkaline aqueous formulations, the Si—O and Si—H links are converted to OH groups, destroying the integrity of the Si—O link and increasing the dielectric of the low-k film.

One useful carbon-doped oxide (OSG) is a low-k material having a dielectric constant in the range of 2.7–3.0. The trend to single wafer tools for photoresist removal and post plasma/ash residual removal has mandated a short cleaning time to maintain wafer throughput. At the same time the introduction of organosilica glass (OSG) dielectrics has made the alkaline strippers and post-ash residual removers less viable since they attack OSG. The solution to high cleaning rate and compatibility with OSG requires new chemistries, which are formulated in such a way as to clean and remove particles without corroding the substrate surface.

Prior art cleaning formulations including highly-acidic, hydrofluoric acid are effective when the wafer substrate is made of a material, such as silicon, silicon dioxide, tungsten, tungsten-titanium alloys or titanium nitride. Such materials are relatively resistant to corrosion by a hydrofluoric acid. However, when made of materials, such as aluminum, aluminum alloys containing copper, copper or carbon-doped oxide, which are relatively less resistant to corrosion by the fluorine compound, the cleaning agent significantly corrodes and dissolves the conductive line pattern and/or dielectric.

Other prior art cleaning formulations have used alkanolamines to remove resist residues. However, if water is present during use, the alkanolamine dissociates and creates an alkaline solution that accelerates the corrosion of metals and dielectrics.

Other prior art cleaning formulations used organic solvents, which are no longer compatible with the new low-k dielectrics as they react with the organic and hydrogen substituents to produce a chemically altered dielectric material.

Hence, there is a need for an improved cleaning formulation that removes organic materials, organometallic residues, organosilicon residues, sidewall polymers and inorganic residues from a semiconductor wafer surface and inside and around via holes when low dielectric constant films and conductive lines containing aluminum and/or copper are exposed to plasma etch and resist ash conditions.

Further, there is a need for a cleaning formulation that is not effected by small changes in the concentration of acidic and/or basic components.

Therefore, it is one object of the present invention to provide an improved cleaning formulation that removes organic materials, organometallic residues, organosilicon residues, sidewall polymers and inorganic residues from a semiconductor wafer surface when low dielectric constant films and conductive lines containing aluminum and/or copper are exposed to plasma etch and resist ash conditions It is a further object of the present invention to produce a cleaning formulation having a pH in a range that does not corrode metal and/or dielectric films and that is not effected by small changes in the concentration of acidic and or basic components.

A still further object of the present invention is to provide a cleaning agent for use in producing semiconductor devices, which meets the above objects.

A still further object of the present invention is to provide a process for producing semiconductor devices, which comprises a step of cleaning a wafer surface with a cleaning formulation that removes organic materials, organometallic residues, organosilicon residues, sidewall polymers and inorganic residues from a semiconductor wafer surface when low dielectric constant films and conductive lines containing aluminum and/or copper are exposed to plasma etch and resist ash conditions.

SUMMARY OF THE INVENTION

The present invention relates to a semi-aqueous cleaning formulation for semiconductor devices comprising a buffering system, and a low temperature process for cleaning a semiconductor substrate using the semi-aqueous formulation.

In one aspect, the present invention relates to a semi aqueous cleaning formulation comprising a buffering system.

In a further aspect, the present invention relates to a semi-aqueous cleaning formulation comprising a buffering system, a fluoride salt and a polar organic solvent and water.

In a still further aspect the present invention relates to a method of removing particles from a semiconductor substrate which includes, providing a semi-aqueous cleaning formulation comprising a buffering system and contacting the wafer surface with the cleaning formulation for a time sufficient to effect the removal of at least of portion of the particles.

DETAILED DESCRIPTION OF THE INVENTION AND PREFERRED EMBODIMENTS THEREOF

The present invention relates to a semi-aqueous cleaning formulation for semiconductor wafers that provides for simultaneous cleaning and/or removal of particles from a wafer surface, while maintaining a fixed pH, thus avoiding unnecessary corrosion of the substrate.

The present formulations provide effective cleaning of the substrates, which means more effective residue removal, which in turn means that higher product yields can be obtained from the substrates being cleaned.

In one embodiment, the present invention relates to a semi-aqueous cleaning formulation comprising a buffering system, wherein said buffering system comprises at least one organic acid, the salt of the organic acid or other conjugate base, and water, such that the buffer system provides a buffering capacity of from about 100 to 1000 mM to change the pH one unit. The buffering capacity is measured by a solution of the buffer only. Preferably the water used in the formulation is high purity deionized water, present in an amount of from about 0 to 70.0% weight by volume of the total formulation, more preferably from about 5.0 to 25.0% weight by volume, and most preferably from about 8.0 to 15.0% weight by volume.

As used herein, the term "semi-aqueous" refers to a mixture of water and organic components.

The buffering system of the present invention should comprise from about 1.0 to 70% weight by volume, and more preferably from about 5.0 to 45% weight by volume of the total composition. The pH of the present solution should be maintained within the range of 3.0 to 8.0, more preferably about 4 to 7 and, most preferably about 4.0 to 6.5. The term "buffer system" refers to a combination of compounds that provide a buffering system in solution that exhibits buffering capacity, that is, the capacity to neutralize within limits, either acids or bases (alkali) with relatively little or no change in the original pH. The buffering system of the present invention serves to maintain the pH of the instant formulation to within a pH of ±1, and as such the potential for oxide etching and/or metal corrosion is limited.

As used herein, the term "buffering capacity" is defined as the millimoles (mM) of strong acid or base (or respectively, hydrogen or hydroxide ions) required to change the pH by one unit when added to one liter (a standard unit) of the buffer solution. The buffering capacity will depend on the kind and concentration of the buffer components.

Organic acids useful in the buffering system of the instant invention include but are not limited to: formic acid, trifluoroacetic acid, propionic acid, butyric acid, valeric acid, heptanoic acid, lactic acid, oxalic acid, malic acid, malonic acid, succinic acid, fumaric acid, adiptic acid, benzoic acid, phtalic acid and citric acid. Conjugate bases useful in the buffering system of the present invention include but are not limited to: a salt of the organic acid, ammonia, tetramethylammonium hydroxide, tetraalkylammonium hydroxide, 2-(methylamino)ethanol, monoisopropanolamine, diglycolamine, N,N-dimethyl-2-(2-aminoethoxy)ethanol, 1-(2-aminoethyl)piperidine, 1-(2-hydroxyethyl)piperazine, 1-(2-aminoethyl)piperazine, 1-(3-aminopropyl)-imidazole, 1,8-diazabicyclo[5.4.0]undec-7-ene, N,N,N'-trimethylaminoethanolamine, pentamethyldiethylenetriamine, ethylmorpholine, hydroxyethylmorpholine, aminopropylmorpholine, triethanolamine, and methyldiethanolamine. In a preferred embodiment, the buffering system of the present invention, comprises lactic acid and ammonium lactate.

In one embodiment, the cleaning formulation of the present invention comprises a multi-component buffering system, such as a lactic acid/lactate and citric acid/citrate buffering system.

In a further embodiment, the present invention relates to a semi-aqueous cleaning formulation comprising a buffering system, and optionally a fluoride source. Preferably, the fluoride source is present in an amount ranging from about 0 to 25.0% weight by volume, more preferably from about 0 to 8.0% weight by volume and most preferably from about 0 to 1.0 percent weight by volume. Suitable fluoride compounds are ammonium fluoride and derivatives thereof, including but not limited to:

ammonium fluoride;

ammonium bifluoride;

tetraalkylammonium fluorides, wherein each alkyl group may be same or different and is selected from the group consisting of $C_1$ to $C_4$, such as tetramethylammonium fluoride (TMAF); and amine fluoride salts, such as, methyldiethanolammonium fluoride (MDEAF);

triethanolammonium fluoride (TEAF);

diglycolammonium fluoride (DGAF);

triethylamine tris (hydrogen fluoride) (TREAT-HF).

In a further embodiment, the present invention relates to a semi-aqueous cleaning formulation useful for removing particles from a semiconductor substrate, wherein said formulation comprises a buffer system, and optionally, a fluoride source and an organic solvent system. Preferably, the organic solvent system is soluble in water. Preferably the organic solvent system comprises at least one polar solvent component. The cleaning formulation may comprise from about 0–95% weight by volume of the solvent system, more preferably between 0 and 80% weight by volume and most preferably between 0 and 70% weight by volume of the organic solvent system. Preferably, at least one component of the organic solvent system comprises an amide or ether functional group. Preferred solvents include but are not limited formamides amide glycol ethers, to N,N-dimethylacetamide, N,N-dimethylformamide, 1-cyclohexyl-2-pyrrolidinone, N-methylpyrrolidone, N-cyclohexylpyrrolidone, N-hydroxyethylpyrrolidone, N-octylpyrrolidone, 1,3-dimethylpiperidone, ethylene glycol, propylene glycol, phenoxyethanol, sulfolane, gamabutyrolactone, butyrolactone, 1,4-butanediol, N,N-dimethylacetoacetamide, N-cyclohexylpyrrolidone, N-octylpyrrolidone, 1-phenoxy-2-propanol, phenoxyethanol, dimethylsulfoxide, diethyleneglycol monobutylether, diethylenegylcol monomethylether, diethylene glycol monoethylether, diethylene glycol monopropyl ether, 1,3-dimethyl-2-imidazolidinone and mixtures thereof.

In a further embodiment, the semi-aqueous cleaning formulation of the present invention may further and optionally comprise a corrosion inhibitor and/or a cleaning agent. The cleaning agent may be present in a concentration ranging from about 0 to 5.0% weight by volume of the total cleaning formulation, preferably 0 to 2% weight by volume of the total cleaning formulation and most preferably from about 0 to 2.0% weight by volume of the total cleaning formulation. The corrosion inhibitor may be present in a concentration ranging from about 0 to 2.5% weight by volume of the total cleaning formulation, preferably 0 to 1.0% weight by volume of the total cleaning formulation and most preferably about 0 to 0.5% weight by volume of the total cleaning formulation.

The corrosion inhibitor serves to react with the substrate surface, which may be metal or non-metal, to passivate the surface and prevent excessive etching during cleaning. The cleaning agent is a substance that chelates to specific metal or non-metal components to be removed, leading to soluble components that can be readily removed during polishing. The corrosion inhibitor and cleaning agent for the instant invention are preferably a carboxylic acid. More specifically, the carboxylic acid may be chosen from, but not limited to glycine, oxalic acid, malonic acid, succinic acid, citric acid, tartaric acid, gluconic acid, nitrilotriacetic acid, their salts and mixtures thereof. Alternatively, the carboxylic acid may be a di, tri or tetra carboxylic acid that preferentially has a nitrogen containing functional group. In the most preferred form, the corrosion inhibitor and the cleaning agent are iminodiacetic acid. Other substances useful as corrosion inhibitors and/or cleaning agents include but are not limited to ethylene-diaminetetraacetic acid (EDTA), benzotriazole (BTA), tolytriazole, BTA derivatives, such as BTA carboxylic acids, boric acid, fluoroboric acid, cystine, haloacetic acids, glucose, dodecyl mercaptan and mixtures thereof.

In a still further embodiment, the present invention may further and optionally comprise at least one surfactant. Suitable surfactants include but are not limited to amphoteric, cationic, anionic, and nonionic, which may be present individually or in combination in amounts up to 0.5%, preferably up to 0.1% and more preferably up to 0.05% weight by volume. Specific non-limiting examples of surfactants are Surfynol®, Triton®, Tergitol®, and Tween®.

In one embodiment, the present invention relates to a cleaning formulation comprising at least one bi-functional component, wherein at least one component serves as both, a component of the buffering system and/or solvent system as well as at least one of, a chelating agent, surfactant, corrosion inhibitor and/or stabilizer.

In one embodiment, the semi-aqueous cleaning formulation of the present invention comprises:

| Component | Percent weight by volume |
|---|---|
| a buffer system comprising: | |
| organic acid | 0.1 to 35.0; |
| salt of organic acid or conjugate base | 0.1 to 40.0; |
| water | 1.0 to 70.0; and |
| organic solvent system | 0 to 95.0; and |
| fluoride salt | 0 to 25.0. |

In one embodiment, the present invention relates to a semi-aqueous cleaning formulation comprising: a lactic acid, ammonium lactate and water buffer system; a 1-cyclohexyl-2-pyrrolidinone and N,N-dimethylacetamide solvent system; and ammonium fluoride.

In a more preferred embodiment, the semi-aqueous cleaning formulation of the present invention comprises:

| Component | Percent weight by volume |
|---|---|
| a buffer system comprising: | |
| lactic acid | 8.14–13.26; |
| ammonium lactate | 13.25–16.95; |
| water | 8.2–10; and |
| organic solvent system: comprising: | |
| 1-cyclohexyl-2-pyrrolidinone | 29.1–31.5; |
| N,N-dimethylacetamide | 34.0–36.8; and |
| ammonium fluoride | 0.27–0.33. |

Other exemplary formulations of the instant invention include but are not limited to:

| Component | Percent weight by volume |
|---|---|
| a buffer system comprising: | |
| formic acid | 26.2; |
| 1-(2-aminoethyl)piperazine (AEP) | 37.0; |
| water | 32.8; and |
| corrosion inhibitor: comprising: | |
| iminodiacetic acid | 3.5 |
| ammonium fluoride | 0.5. |

| Component | Percent weight by volume |
|---|---|
| a buffer system comprising: | |
| formic acid | 28.7; |
| 1-(2-aminoethyl)piperazine (AEP) | 37.0; |
| water | 33.8; and |
| ammonium fluoride | 0.5. |

| Component | Percent weight by volume |
|---|---|
| a buffer system comprising: | |
| formic acid | 26.4; |
| 1-(2-aminoethyl)piperazine (AEP) | 37.6; |
| water | 32.5; and |
| corrosion inhibitor: comprising: | |
| iminodiacetic acid | 3.5 |

| Component | Percent weight by volume |
|---|---|
| a buffer system comprising: | |
| formic acid | 31.0; |
| 1-(2-aminoethyl)piperazine (AEP) | 36.1; |
| water | 32.9 |

The cleaning formulation of the instant invention may have multiple cleaning uses and is not limited to post etch and resist residue removal. For example, the cleaning formulation of the instant invention when diluted with water in a ratio of from about 1 part formulation to 12 parts water, is useful for post chemical mechanical polishing cleaning.

The cleaning formulation is useful in cleaning wafer surfaces of multiple particle residues, particularly post etch and post ash residues from a carbon doped dielectric thin film. In one embodiment, the instant invention relates to a method of removing particles from a semiconductor substrate. Representative particle compositions include positive photoresists, electron beam resists, X-ray resists, ion beam resists, and the like. Examples of plasma processing residue sidewall polymers include among others, metal-organic complexes and/or inorganic salts, oxides, hydroxides or complexes of the organic polymer resins of a photoresist.

In a further embodiment, the present invention relates to a method for removing particles from a semiconductor wafer surface, said method includes providing a semi-aqueous cleaning formulation comprising a buffering system and contacting the wafer surface with said cleaning formulation for a time sufficient to effect the removal of at least of portion of the particles.

The method of cleaning a wafer surface using the cleaning compositions of the present invention involves contacting a substrate having residue thereon, particularly organometallic or metal oxide residue, with a cleaning composition of the present invention for a time and at a temperature sufficient to remove the residue. Stirring, agitation, circulation, sonication or other techniques as are known in the art optionally may be used. The substrate is generally immersed in the cleaning composition. The time and temperature are determined based on the particular material being removed from a substrate. Generally, the temperature is in the range of from about ambient or room temperature to 45° C., and the contact time is from about 30 seconds to 60 minutes. The preferred temperature and time of contact for this invention is 20 to 45° C. and from about 1 to 10 minutes. The formulation may be removed from the wafer by any method readily know to those skilled in the art. However, preferably, the formulation is removed by spin-drying. Generally, the wafer is preferably rinsed with a solvent such as ethanol or deionized water to complete the cleaning process.

In one embodiment, the present invention relates to a method of removing particles from a semiconductor substrate comprising a step of forming an insulation film on a semiconductor substrate, a step of dry-etching the insulation film into a prescribed pattern and a step of cleaning the resultant product with a semi-aqueous cleaning formulation comprising a buffer system, an organic solvent system and a fluoride source.

In a further embodiment, the present invention relates to a method of removing particles from a semiconductor substrate comprising a step of forming a conductive line pattern from a metal material or a semiconducting material on a semiconductor substrate, a step of forming an insulation film on the conductive line pattern, a step of forming a via hole in the insulation film by dry etching and a step of cleaning the resultant product with a semi-aqueous cleaning formulation comprising a buffer system, an organic solvent system and a fluoride source.

In a still further embodiment, the present invention relates to a method of removing particles from a semiconductor substrate comprising a step of forming a film of a metal material or a semiconducting material on a semiconductor substrate, a step of dry-etching the film into a conductive line pattern and a step of cleaning the resultant product with a semi-aqueous cleaning formulation comprising a buffer system, an organic solvent system and a fluoride source.

In a further embodiment, the method of the instant invention may further comprise an agitating means, wherein the wafer is contacted with the cleaning formulation and agitated by means of shaking, megasonic or ultrasonic to aid in freeing particles adhering to the substrate surface or trapped in vias or trenches.

The present invention is not limited to the particular embodiments shown and described herein, but that various changes and modifications may be made without departing from the scope and spirit of the invention.

The features, aspects and advantages of the present invention are further shown with reference to the following non-limiting example relating to the invention.

EXAMPLE

Example 1

Metal Etch rates at 100%

Formulation:
pH of approximately 6

| Component | Percent weight by volume |
|---|---|
| a buffer system comprising: | |
| boric acid | 5.0; |
| formic acid | 19.0 |
| 1-(2-aminoethyl) piperazine (AEP) | 26.0; |
| water | 48.6; and |
| corrosion inhibitor: comprising: | |
| citric acid | 0.4; and |
| ammonium fluoride | 1.0 |

Recommended Process Conditions:
Time: 10 Minutes
Process Temperature: 40° C.
DI H20 Rinse: 3 Minutes

TABLE 1

| Film | Etch rate @ 100% |
|---|---|
| AlCu | 1–8 Å/min |
| Cu | 1.2–4.1 Å/min |
| TaN | 13.6 Å/min |
| Ti | 0.55 Å/min |
| W | 0.2 Å/min |
| TiN | 5.6 Å/min |
| Thermal Ox | 3.0 Å/min |
| Poly Si | 0.6 Å/min |

Example 2

Cleaning of Metal Lines

Figure 2:
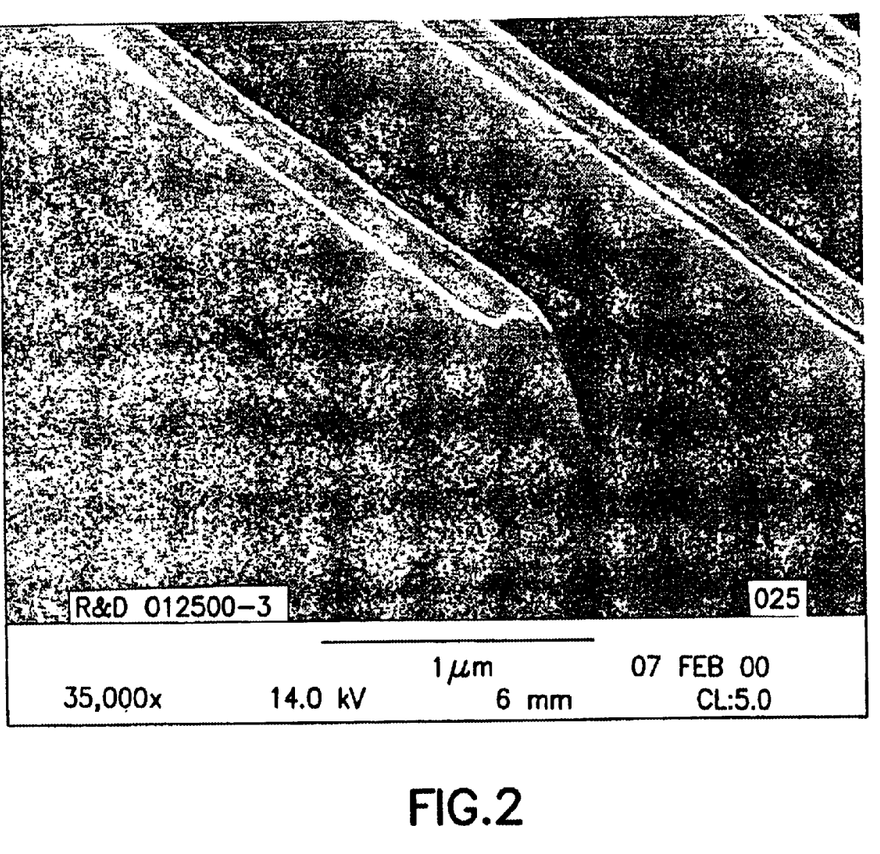
FIG. 2 shows an aluminum metal line having residue, prior to chemical processing.
Figure 3:
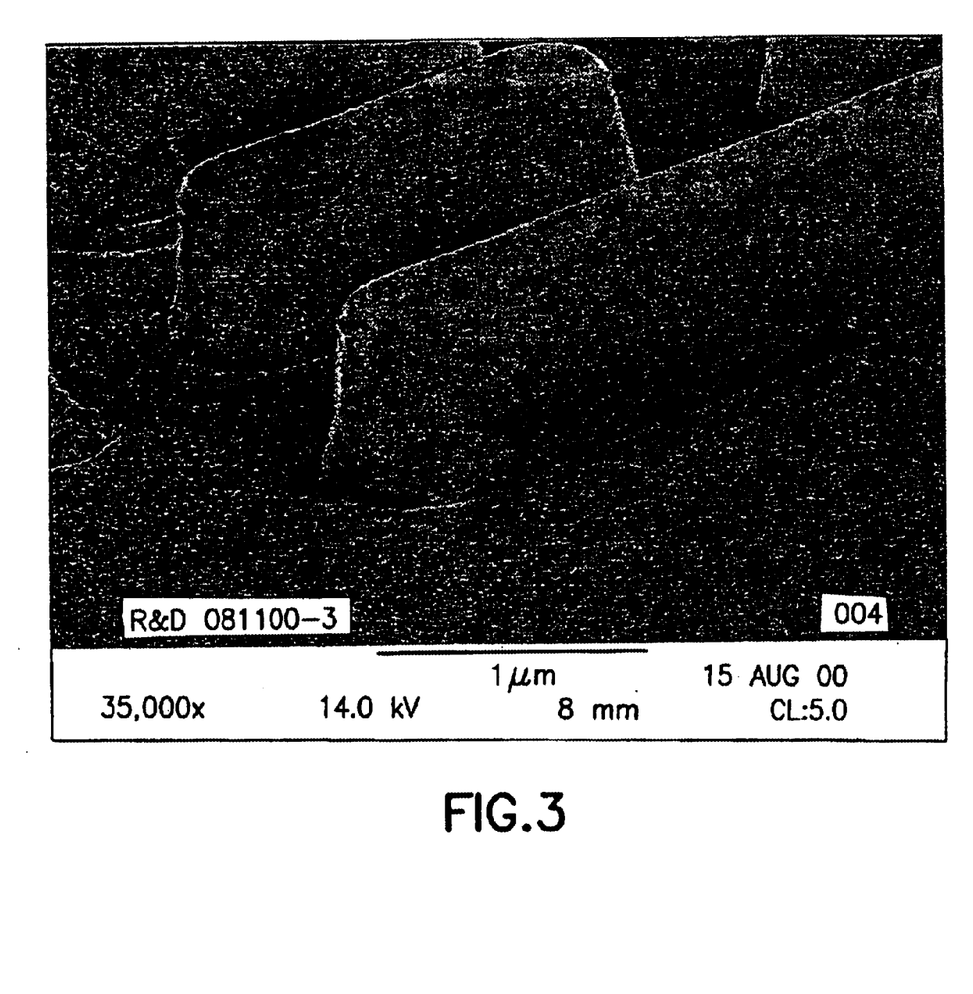
FIG. 3 shows the aluminum metal line of FIG. 2, after chemical processing.

The same formulation as used in Example 1, was used to clean aluminum/copper metal lines:

FIG. 2 and FIG. 3 show the aluminum/copper metal lines before (FIG. 2) and after (FIG. 3) cleaning with the above formulation. Experimental conditions included a processing temperature of 40° C. for a time of 10 minutes, followed by a deionized (DI) water rinse.

Example 3

Cleaning of Via Structure

Figure 4:
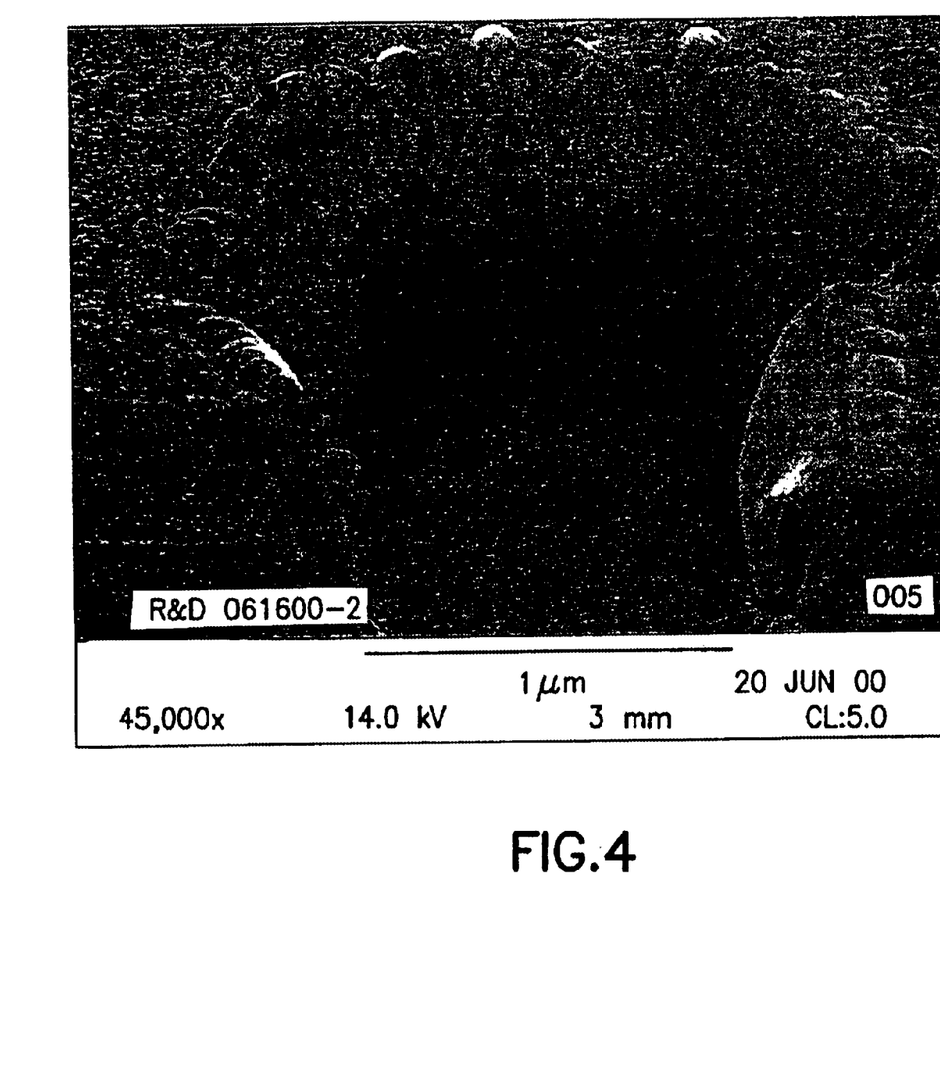
FIG. 4 shows a via structure having residue, prior to chemical processing.
Figure 5:
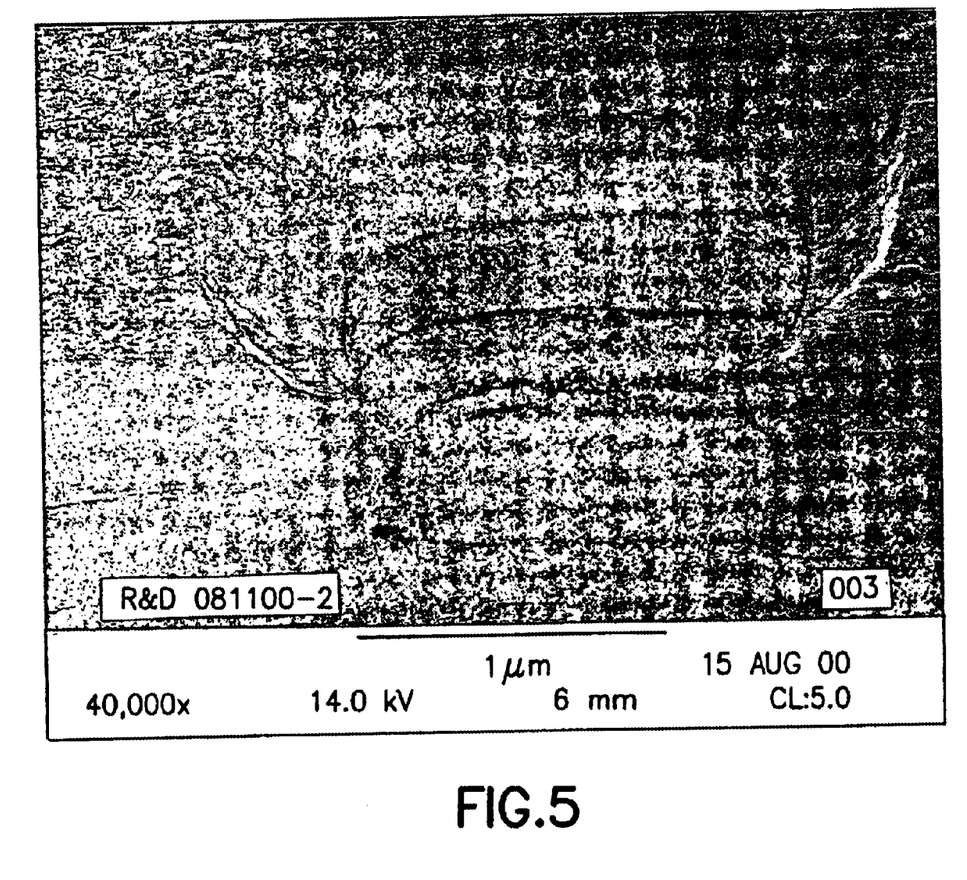
FIG. 5 shows the via structure of FIG. 4, after chemical processing.

The same formulation as used in Example 1 was used to clean a via structure:

FIG. 4 and FIG. 5 show a via structure comprising silicon dioxide, before (FIG. 4) and after (FIG. 5) cleaning with the above formulation. Experimental conditions included a processing temperature of 40° C. for a time of 10 minutes, followed by a deionized (DI) water rinse.

Although the present invention has been described in detail, it should be understood that various changes, substitutions and alterations can be made hereto without departing from the spirit and scope of the invention as described by the appended claims.

What is claimed is:

1. A semi-aqueous cleaning formulation for semiconductor devices, comprising: lactic acid, ammonium lactate, water, 1-cyclohexyl-2-pyrrolidinone and N,N-dimethylacetamide and ammonium fluoride.

2. The semi-aqueous cleaning formulation of claim 1, wherein said formulation comprises:

| Component | Percent weight by volume |
|---|---|
| lactic acid | 8.14–13.26; |
| ammonium lactate | 13.25–16.95; |
| water | 8.2–10; |
| 1-cyclohexyl-2-pyrrolidinone | 29.1–31.5; |
| N,N-dimethylacetamide | 34.0–36.8; and |
| ammonium fluoride | 0.27–0.33. |

3. A semi-aqueous cleaning formulation for semiconductor devices comprising:

| Component | Percent weight by volume |
|---|---|
| formic acid | 26.2; |
| 1-(2-aminoethyl)piperazine (AEP) | 37.0; |
| water | 32.8; and |
| iminodiacetic acid | 3.5 |
| ammonium fluoride | 0.5. |

4. A semi-aqueous cleaning formulation for semiconductor devices comprising:

| Component | Percent weight by volume |
|---|---|
| formic acid | 28.7; |
| 1-(2-aminoethyl)piperazine (AEP) | 37.0; |
| water | 33.8; and |
| ammonium fluoride | 0.5. |

5. A semi-aqueous cleaning formulation for semiconductor devices comprising:

| Component | Percent weight by volume |
|---|---|
| formic acid | 26.4; |
| 1-(2-aminoethyl)piperazine (AEP) | 37.6; |
| water | 32.5; and |
| iminodiacetic acid | 3.5. |

6. The semi-aqueous cleaning formulation for semiconductor devices, wherein said formulation comprises:

| Component | Percent weight by volume |
|---|---|
| formic acid | 31.0; |
| 1-(2-aminoethyl)piperazine (AEP) | 36.1; |
| water | 32.9. |

7. A method for removing particles from a semiconductor wafer surface, said method comprising contacting the wafer surface with a semi-aqueous cleaning formulation for a time sufficient to effect the removal of at least a portion of the particles from the wafer surface, said cleaning formulation comprising lactic acid, ammonium lactate, water, 1-cyclohexyl-2-pyrrolidinone and N,N-dimethylacetamide and ammonium fluoride.

8. A method of removing particles from a semiconductor substrate comprising: forming an insulation film on a semiconductor substrate; dry-etching the insulation film into a prescribed pattern, thereby producing particles comprising at least one resultant product from the insulation film on the semiconductor substrate; and cleaning the resultant product with a semi-aqueous cleaning formulation comprising lactic acid, ammonium lactate, water, 1-cyclohexyl-2-pyrrolidinone and N,N-dimethylacetamide and ammonium fluoride.

9. A method of removing particles from a semiconductor substrate comprising: forming a conductive line pattern from a metal material or a semiconducting material on a semiconductor substrate; forming an insulation film on the conductive line pattern, forming a via hole in the insulation film by dry etching, thereby producing particles comprising at least one resultant product from the insulation film or the metal material on the semiconductor substrate; and cleaning the resultant product with a semi-aqueous cleaning formulation comprising lactic acid, ammonium lactate, water, 1-cyclohexyl-2-pyrrolidinone and N,N-dimethylacetamide and ammonium fluoride.

10. A semi-aqueous cleaning formulation for semiconductor devices comprising formic acid, 1-(2-aminoethyl) piperazine (AEP), water and iminodiacetic acid.

11. A semi-aqueous cleaning formulation for semiconductor devices comprising formic acid, 1-(2-aminoethyl) piperazine (AEP), water and ammonium fluoride.

12. A method for removing particles from a semiconductor wafer surface, said method comprising contacting the wafer surface with a semi-aqueous cleaning formulation for a time sufficient to effect the removal of at least a portion of the particles from the wafer surface, said cleaning formulation comprising formic acid, 1-(2-aminoethyl)piperazine (AEP) and water.

13. A method of removing particles from a semiconductor substrate comprising: forming an insulation film on a semiconductor substrate; dry-etching the insulation film into a prescribed pattern, thereby producing particles comprising at least one resultant product from the insulation film on the semiconductor substrate; and cleaning the resultant product with a semi-aqueous cleaning formulation comprising formic acid, 1-(2-aminoethyl)piperazine (AEP) and water.

14. A method of removing particles from a semiconductor substrate comprising: forming a conductive line pattern from a metal material or a semiconducting material on a semiconductor substrate; forming an insulation film on the conductive line pattern, forming a via hole in the insulation film by dry etching, thereby producing particles comprising at least one resultant product from the insulation film or the metal material on the semiconductor substrate; and cleaning the resultant product with a semi-aqueous cleaning formulation comprising formic acid, 1-(2-aminoethyl)piperazine (AEP) and water.

* * * * *